Jan. 23, 1973 T. P. LITTY ET AL 3,713,006

HYBRID TRANSISTOR

Filed Aug. 23, 1971 4 Sheets-Sheet 1

THOMAS P. LITTY
ELLSWORTH R. MOSS
EDWARD J. RICE
INVENTORS

BY Spensley, Horn & Lubitz
ATTORNEYS

THOMAS P. LITTY
ELLSWORTH R. MOSS
EDWARD J. RICE
INVENTOR.

BY Spensley, Horn & Lubitz
ATTORNEYS

Jan. 23, 1973 T. P. LITTY ETAL 3,713,006

HYBRID TRANSISTOR

Filed Aug. 23, 1971 4 Sheets-Sheet 3

THOMAS P. LITTY
ELLSWORTH R. MOSS
EDWARD J. RICE
INVENTORS

BY Spensley, Horn & Lubitz
ATTORNEYS

THOMAS P. LITTY
ELLSWORTH R. MOSS
EDWARD J. RICE
INVENTORS

BY Spensley, Horn & Lubitz
ATTORNEYS

United States Patent Office 3,713,006
Patented Jan. 23, 1973

3,713,006

HYBRID TRANSISTOR

Thomas P. Litty, Los Angeles, Ellsworth R. Moss, Palos Verdes, and Edward J. Rice, Los Angeles, Calif., assignors to TRW Inc., Los Angeles, Calif.

Continuation-in-part of application Ser. No. 113,272, Feb. 8, 1971. This application Aug. 23, 1971, Ser. No. 173,774
Int. Cl. H01l 19/00
U.S. Cl. 317—101 A 41 Claims

ABSTRACT OF THE DISCLOSURE

A hybrid transistor comprising a transistor die and internally disposed capacitive elements configured to reduce substantially the inductance of the transistor's input, typically the base in common emitter configurations, while at the same time providing a built-in first stage network for broad-band impedance matching and impedance transformation. In a basic embodiment of this invention, the transistor die is disposed upon a common metallized area of a transistor package. Typically, the collector regions are in electrical contact with this metallized area. Relatively short and uniform base lead bonds connect each of a plurality of base regions to one side of an array of corresponding capacitors disposed upon a second metallized area which serves as the common emitter. The second sides of the capacitors are in contact with the common emitter area. The emitter regions of the transistor die are likewise connected to the common emitter area through relatively short and uniform lead bonds. In a preferred embodiment of the present invention, additional lead bonds also connect the emitter regions to the common emitter side of the capacitor array. By making the latter emitter lead bonds of the same length and contour as the base lead bonds, and by interleaving them in parallel with the base lead bonds, a further reduction of the input inductance of the invented hybrid transistor is achieved. The present invention discloses a transistor having superior high frequency operating characteristics than heretofore attainable at power levels in excess of 40 watts. The superior operating characteristics, including low input inductance and low impedance transformation, enable broad-band uniform amplication over as much as one octave of the frequency band above 100 mHz.

This is a continuation-in-part of our co-pending application, Ser. No. 113,272, entitled "High Frequency, High Power Transistor," filed Feb. 8, 1971, which discloses earlier embodiments of the present invention.

BACKGROUND OF THE INVENTION

(1) Field of the invention

The present invention generally relates to the field of semiconductor devices and, more specifically, to those devices adapted for providing high power signal outputs at high frequencies.

(2) Prior art

The advances of modern technology have increased the demand for semiconductor devices which are capable of reliably producing high power output signals at high frequencies; i.e., at frequencies above 100 mHz. However, it has heretofore been impossible to utilize a high power transistor over an octave or more of the high frequency range except by the use of tunable, and often elaborate impedance matching networks interposed between the drive source and the input to the transistor. Typically, transistors of the prior art capable of operating at above 15 watts have been limited to a 20%–30% bandwidth at any frequency in the VHF or UHF range. This bandwidth limitation, present in even the best of conventional transistors, is due to the combination of parasitic reactances within the transistor package and in the lead bonds to the transistor die, as well as the lower base resistance of higher power devices.

A greater deal of effort has been expended in the prior art to minimize the introduction of parasitic reactances by sophisticated packaging designs and techniques. This effort has been reasonably effective with UHF transistors rated below the 15 watt level. In UHF transistors required to operate about 15 watts, however, the parasitic reactances cannot be reduced sufficiently, due to the physical lengths of the lead bonds, the relatively large semiconductor dies and the size of the package necessary to achieve the current carrying and heat dissipation capacities of a reliable high power device. Thus, for example, in a typical high power transistor, the distance from the surface of the semiconductor die to the input terminal is sufficiently great so as to require a base lead bond which introduces a significant amount of inductance. The presence of excessive lead bond inductance between the base terminal and the base regions of the transistor die increases the Q of the device which, in turn, limits its bandwidth, it being well-known that the operating bandwidth of a device is inversely proportional to its input Q.

In order to mitigate the detrimental effect on bandwidth attributable to the inductance introduced by the base lead bond, the prior art teaches the use of any one of a number of known impedance matching networks disposed externally between the drive source and the transistor base terminal. These networks, in conjunction with the base inductance, are typically tuned to a desired operating frequency. In this manner, acceptable high frequency performance over a relatively broad band, as measured by a low voltage standing wave ratio, VSWR, may be achieved in conventional transistors below 15 watts. However, with respect to UHF transistors designed to operate above 15 watts, low VSWR can be achieved only over a 20%–30% frequency band. This is due to the high Q of conventional UHF transistors rated above 15 watts. The inherent bandwidth limitation imposed by the Q of a conventional device makes it impossible to design one or a series of external impedance matching network stages which can provide an acceptable VSWR over one octave of the high frequency band, except by including within the matching network tuning means which will enable the matching network to be tuned at each 20%–30% frequency band within the octave. The requirement to use matching networks, especially tunable networks, significantly increases the cost of a high frequency amplifier and, because of the additional components, reduces the amplifier's overall reliability while increasing its size. Impedance matching networks typically utilized in the above-described manner include quadrature 90° hybrids, Matthaei and R, L, C networks.

As indicated above, an established measure of the high frequency performance of electronic amplifiers is the voltage standing wave ratio, commonly referred to as the VSWR. The VSWR is a measure of the amount of input energy reflected back from the input of the transistor to the drive source. A VSWR of 2.0 to 1.0 represents an approximately 20% level of reflected energy, the level generally considered to be the maximum tolerable. Higher levels of reflected energy are not tolerable in that they can cause spurious oscillation in the drive source or if high enough, can burn out the drive source due to the amount of reflected energy which must be dissipated.

Thus, the impedance matching networks utilized must either dissipate or isolate the reflected energy to prevent it from reaching the drive source.

Impedance matching networks are typically tuned at the high end of the desired frequency band in order to take advantage of gain-slope compensation; i.e., of the fact that the transistor's gain increases as the frequency decreases, thereby compensating for the lesser amount of energy reaching the transistor input due to the higher VSWR at frequencies below the 20%–30% tuned frequency band. This has required the users of prior art transistors to design and utilize impedance matching networks which can dissipate the reflected signal energy at the lower end of the operating frequency band in order to protect the drive source. This type of network, called a "suck-out" circuit in the art, is often implemented with a quadrature combiner. A suck-out circuit is generally useful in single ended amplifiers which operate at power levels up to 15 watts. At power levels in excess of 15 watts, however, the overall amplifier efficiency becomes too low as an unacceptable amount of signal energy is uselessly dissipated in the suck-out circuit. Thus, the use of impedance matching networks as a means of operating a conventional transistor above 100 mHz., as disclosed by the prior art, suffers from the disadvantages of (i) high VSWR at frequencies outside of a narrow 20%–30% tuned frequency band, (i.e., low efficiency in broad-band applications), and (ii) additional components.

A further disadvantage heretofore experienced with conventional transistors used in high frequency, high power applications relates to the energy loss incident to high impedance transformation in the first stage of the matching network. Since the input of a transistor typically presents too low an impedance to the drive source, impedance transformation is required in order to optimize the transfer of signal power from the drive source to the transistor. Energy losses occur, however, in the resistive portions of the tuning components comprising the network. The higher the impedance transformation, the greater the energy loss experienced. The relatively high input inductance (or high Q) of conventional high power transistors results in a high impedance transformation in the first stage of the impedance matching network. Circuit losses with conventional transistors typically run from 10%–20%. In addition, because of the high Q of conventional high power transistors, the first stage impedance transformation typically occurs only over a narrow band of frequencies, whereas, broad-band performance requires broad-band impedance transformation.

As indicated above, the devices disclosed by the prior art which are capable of operating at UHF frequencies have heretofore been limited to power output signal levels below 15 watts because of the excessive increase of input Q at power levels above 15 watts. It has been pointed out that it is the parasitic input inductances incident to the large physical dimensions of high power devices which is responsible for this limitation. Another reason for the high input Q at power levels above 15 watts is the reduction of overall base resistance $R_b'$ which has heretofore resulted from the direct coupling of additional parallel base regions on the transistor die. High power transistors are typically a parallel configuration of several smaller transistor chips or cells. In power transistors disclosed by the prior art, the base regions of the parallel transistor cells have typically been directly coupled to the base terminal of the package, resulting in lower $R_b'$ values. The adverse effect upon the Q of the device was further compounded by the parasitic inductance introduced by the lead bonds tying together the base regions. A still further shortcoming of such devices of the prior art relates to base resistance imbalance. When the base resistance of any one of the coupled transistor cells becomes lower for any reason, the drive power to that transistor cell increases, thereby increasing its temperature. The increase in temperature, in turn, causes additional reduction in the base resistance so as to create a condition of thermal runaway and severe electrical imbalance. Of course, the higher temperatures within the transistor cell having the lower base resistance has the effect of increasing its probability of electrical failure.

The present invention overcomes these shortcomings and limitations of the prior art by disclosing a new hybrid transistor having a substantially lower input inductance (or Q) and, thereby, superior high frequency performance characteristics over a full octave of the frequency band above 100 mHz., at power levels over 40 watts. In its simplest form, the invented hybrid transistor incorporates within its package at least one discrete capacitor, thus the name "hybrid transistor." The internalized capacitors are connected between the base terminal of the transistor package and the emitter terminal in, for example, a common emitter configuration. The object of the capacitors is to reduce the effect of parasitic inductive reactances within the transistor, especially in the high power transistor, by forming, in combination with the parasitic inductances of the base lead bonds, the first section of one or more impedance matching and transformation networks. The capacitors are selected to tune out the inductances of the base lead bonds, preferably at the highest frequency of the desired operating band. The resulting Q of the invented hybrid transistor is substantially less than that heretofore achievable in devices of the prior art. As a result, the present invention makes possible broad-band high frequency transistors adapted to operate at power levels about 40 watts. With an appropriate external impedance matching network, the following performance characteristics are attainable in an amplifier utilizing the invented hybrid transistor across one octave of the frequency band above 100 mHz.;

(i) a VSWR of less than 2.0 to 1.0;

(ii) relatively low impedance transformation due to the fact that the invented transistor's input impedance is more resistive than that of conventional transistors.

The lower VSWR results in an improvement of the overall efficiency of amplifiers utilizing the invented transistor by reducing the reflected energy which must be dissipated in the intermediate matching networks. Likewise, as a result of the broad-band low impedance transformation made possible by the present invention, circuit losses are reduced.

With reference to the problem in the prior art relating to base resistance reduction and imbalance, which limited the ability to increase transistor power by the use of additional parallel transistor cells, the present invention overcomes this shortcoming by teaching the use of internal capacitors at intermediate points between each of a number of base sites on the transistor die and the base terminal of the transistor package as a means of electrically isolating the base sites from one another. The capacitors and the parasitic inductance of the lead bonds form an effective quarterwave transmission line in the path between each base site and the base terminal; the isolation afforded by these effective transmission lines substantially eliminate base resistance reduction and base resistance imbalance, as more fully explained hereinbelow.

BRIEF SUMMARY OF THE INVENTION

The present invention is a hybrid transistor which exhibits superior high frequency operating characteristics than heretofore achievable at power levels over 40 watts. It enables high power broadband amplification across one octave of the frequency band above 100 mHz. In its simplest form it is comprised of a transistor die and one or more capacitors contained within a basic transistor package capable of accommodating them. In preferred embodiments of this invention, however, both the transistor package and the transistor die are designed to optimize the benefits derivable from including the capacitors within the package.

A planar piece of insulating material, having first and second metallized areas on its upper surface, is contained within a basic transistor package. The metallized areas are deposited by conventional methods and are preferably gold plated layers of copper or of the alloy covar. The insulating material is preferably a thermally conducting ceramic such as, for example, beryllium oxide. A transistor die, comprising one or more transistor cells, is secured to the first metallized area. The power rating of each transistor cell is typically in the range of 1–2 watts so that the power output of the entire device can exceed 40 watts at frequencies above 100 mHz. When a multicell transistor die is used, the separate transistor cells are produced in a common wafer, typically silicon, the body of which constitutes the common collector region of all of the cells. The base regions and emitter regions within each cell are typically interconnected by a conventional contact metal, such as gold. The common base and emitter regions of each cell, in turn, are interconnected so as to form one or more base and emitter sites. In a preferred embodiment of the present invention having a plurality of base and emitter sites, the base and emitter sites are located in an alternating pattern along the approximate centerline of the transistor die.

By securing the transistor die to the first metallized area, the common collector region is placed in electrical contact therewith. A collector terminal of the basic transistor package is affixed to the first metallized area and, therefore, to the common collector of the transistor die.

In order to reduce emitter lead inductance, which is typically present in both the input and output networks of a common emitter configuration, preferred embodiments of the present invention utilize a "split ground"; that is, a pair of ground terminals, one on each side of the transistor package, tied together through the second metallized area at one end and by a connecting bar on the other. Emitter sites on the transistor die are connected to the center of the connecting bar.

The base sites on the transistor die are connected to the center of an input terminal of the transistor package by one or more uniform base lead bonds. One or more capacitors are connected, in turn, between the input terminal and the second metallized area, i.e., the emitter region between the ground terminals. Two capacitors are preferred, i.e., one capacitor between the input terminal and each end of the second metallized area. The symmetrical configuration comprised of the pair of capacitors and the pair of ground terminals affords a balanced circulation of currents through each half of the invented transistor, resulting in an approximately equal distribution of energy through the transistor die. This result is beneficial in that it mitigates the development of "hot" spots, i.e., places in the transistor die where excessive energy must be dissipated, and, thereby, enhances the capacity of the present invention to operate at high power levels. In addition, the use of two capacitors in parallel is preferred for two other reasons. Firstly, the efficiency of the circuit is improved in that less current flows through each capacitor and, therefore, there is less loss. Secondly, the small parasitic inductance introduced by the two capacitors in parallel is one-half of that of a single capacitor. Any high Q ceramic microminiature capacitor that can fit within the transistor package is suitable in this application, as well as MOS (metal oxide silicon) capacitors. It should be understood that this invention also contemplates the use of MOM (metal oxide metal) capacitors.

The internal capacitors, in combination with the parasitic inductances of the base lead bonds form the first sections of impedance matching and transformation networks. The two capacitors are of the same value, the latter being selected so as to tune out the inductances of the base lead bonds (i.e., to resonate) preferably at the highest frequency of the desired operating band. Consequently, the Q values of the invented hybrid transistor are substantially lower than was heretofore achievable. Whereas conventional transistors typically have Q values in the range from 6–10, the present invention can be characterized by Q's from 1–2. The resulting Q of the present invention enables its broad-band, high frequency performance at power levels higher than achievable by the prior art.

In preferred embodiments of the present invention disclosed hereinbelow, broad-band performance is attained at power levels in excess of 40 watts. This is accomplished by using larger transistor dice, having more base and emitter sites configured in parallel, in conjunction with a plurality of internal capacitors in more complex circuit configuration than in the relatively simple embodiments described above. In the higher power embodiments of this invention, one plate of each internal capacitor is connected to a particular base site and to the input terminal by first and second base lead bonds respectively. These lead bonds are relatively short, equal and uniform. The second plate of each capacitor is typically connected to the second metallized area, i.e., to the emitter region between the two ground terminals. The capacitors are selected to provide the same reactance as the first and second base lead bonds at the highest frequency of the desired operating range. Similarly, relatively short and uniform emitter lead bonds interconnect each of the emitter sites on the transistor die to the center of the emitter terminals' connecting bar. The resulting configuration provides the high power capabilty of a large multicell transistor die without the limitations of high Q due to increased input inductance and decreased base resistance, or the problem of base resistance imbalance and thermal runaway which heretofore limited the number of transistor cells which could be operated in parallel. This improvement is a result of the following aspects of the invented configuration: (i) there is less base lead bond inductance to tune out because the capacitor is connected midway between each base site and the base terminal; (ii) at frequencies within the operating bandwidth of the present invention, the impedance matching and transformation network sections, comprising each capacitor and its corresponding pair of base lead bonds, act like effective quarterwave transmission lines between each base site and the base terminal, providing the requisite electrical isolation of the parallel base sites as well as preventing thermal runaway; and (iii) the symmetrical configuration of capacitors, lead bonds, emitter terminals, etc. which ensure substantially uniform energy distribution through the invented device.

In another preferred embodiment of the present invention, additional lead bonds are utilized to connect the emitter sites on the transistor die to "ground stripes" which are in contact with the second metallized area (the common emitter region). These additional emitter lead bonds are of the same length as the base lead bonds, and they are interleaved in parallel with them. As a result of the current flow in the parallel base and emitter lead bonds, typically in opposite directions, there is a further reduction of the effective inductance introduced by the base lead bond between each capacitor and its corresponding base site.

The novel placement of capacitors within the basic transistor package, as disclosed by the present invention, provides significant advantages over the use of conventional transistors and external capacitors impedance matching networks for tuning out the parasitic inductances of the base lead bond. For one thing, internalizing the capacitors reduces the amount of base inductance which must be tuned out. Secondly, there are less circuit losses due to the lower impedance transformation which takes place in the first section (the internal section) of the network. In addition, circuit losses are also reduced because of the shorter paths involved. A further advantage of the present invention lies in its affording the capability to include multiple sections of internal impedance matching and transformation networks. By so doing, the impedance level of the invented hybrid transistors can be set at any of a number of convenient values. A still further advantage of the present invention over the use of conventional transistors and external impedance matching networks is the high reproducibility of results which are achievable in production quantities. Whereas production methods known in the art can readily produce large numbers of the invented hybrid transistor, having, within acceptable tolerances, the requisite characteristics such as, for example, uniform lead bond lengths and symmetry of configuration, the circuit designer attempting to achieve comparable results with external components is faced with so many variables that large scale reproducibility of results is either impossible or impractical. It is obvious, therefore, that the practice of this invention is imperative as power and frequency requirements increase. Although good high power performance over one octave may not be achieved at frequencies approaching 5 ghz., substantially bandwidth improvement will be achieved.

The novel features which are believed to be characteristic of the invention, both as to its organization and method of operation, together with further objections and advantages thereof, will be better understood from the following description considered in connection with the accompanying drawings in which presently preferred embodiments of the invention are illustrated by way of example. It is to be expressly understood, however, that the drawings are for the purpose of illustration and description only, and are not intended as a definition of the limits of the invention.

DETAILED DESCRIPTION OF THE INVENTION

Figures 1, 2:
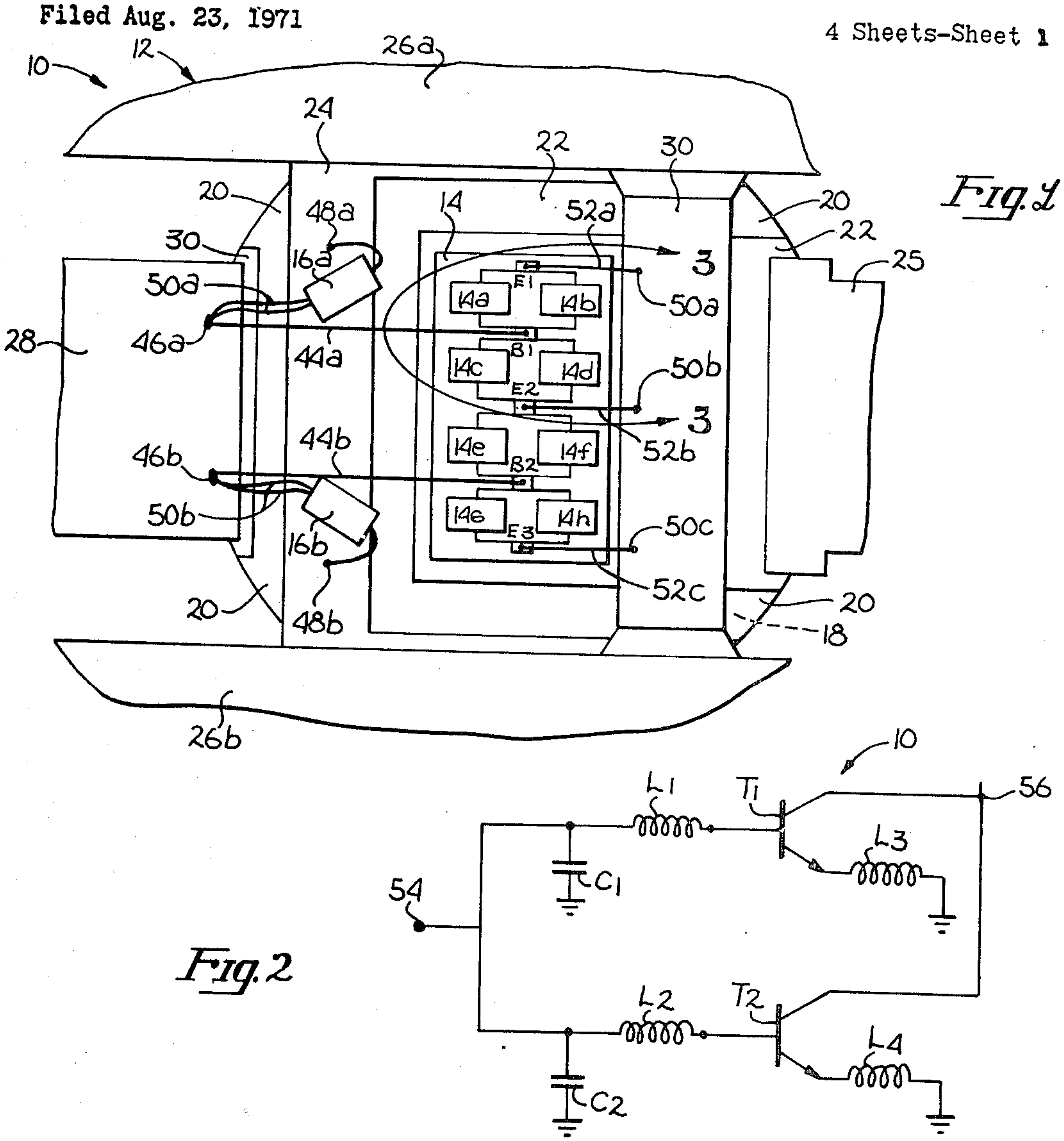
FIG. 1 is a top plan view of a first preferred embodiment of a hybrid transistor in accordance with the present invention.
FIG. 2 is a schematic representation of the hybrid transistor shown in FIG. 1.

The present invention is adapted for operation with input signals having high frequency characteristics, high frequencies being generally understood to include those frequencies in excess of 100 mHz. An understanding of the present invention can be best gained by reference to FIGS. 1–2, wherein a first preferred embodiment of the present invention is shown, the invented hybrid transistor shown therein being generally designated by the reference numeral 10. Transistor 10 is a relatively simple embodiment of this invention, adapted to operate at power levels from 20 to 30 watts. Transistor 10 is comprised of a basic transistor package 12, transistor die 14, and internal capacitors **16*a* and 16*b* configured as described hereinbelow in connection with FIG. 1. Although two capacitors 16*a* and 16*b* are disclosed with respect to transistor 10**, it should be understood that the present invention contemplates, and would be operative with one internal capacitor.

The basic transistor package 12 is comprised of a main body 18 upon which is disposed a planar thermally conducting member 20. Thermally conductive member 20 is preferably a ceramic fabricated of beryllium oxide because of the requisite heat dissipation requirements arising out of the contemplated operation of hybrid transistor 10. Heat dissipated in the transistor die 14 and the capacitors **16*a* and 16*b* is conducted through ceramic member 20 to main body 18, the latter being a gold plated heat conducting metal which functions as a heat sink for transistor 10. Although ceramic member 20** is preferably beryllium oxide, other suitable thermally conductive materials could be used. Conventional precautions and procedures should be used in handling and processing beryllium oxide because of its hazardous nature.

First and second metallized areas 22 and 24, respectively, are deposited by conventional methods over a portion of ceramic member 20. The metallized areas are preferably gold plated layers of copper or of the alloy covar. A collector terminal 25 is attached to the first metallized area 22, while two ground terminals **26*a* and 26*b* are attached to the second metallized area 24 in what is known as a "split ground" configuration; the split ground configuration reduces the emitter lead inductance typically introduced into the input and output networks which are used in conjunction with high frequency transistors such as transistor 10. Ground terminals 26*a* and 26*b* extend in a direction parallel to, and on each side respectively of, collector terminal 25. An input terminal 28 is affixed to a third metallized area 31 deposited on ceramic member 20. The longitudinal axis of input terminal 28 is approximately coincident with that of collector terminal 25. Thus, ground terminals 26*a* and 26*b* also extend in a direction parallel to, and on each side respectively of, input terminal 28. A bridge 30, passing over the metallized area 22, is affixed to each of ground terminals 26*a* and 26*b*. Thus, ground terminals 26*a* and 26*b* are electrically connected by both the metallized area 24 and the bridge 30. The collector ground and input terminals 25, 26*a*, 26*b* and 28 respectively are preferably made of the same material as that used for the metallized areas. Although the basic transistor package 12** described is a common emitter (or grounded emitter) configuration, it is understood that this configuration is for the purpose of example only, a common base configuration also being within the scope and contemplation of the present invention.

Transistor die 14, comprising a plurality of individual transistor cells **14*a*–14*h*, is secured to metallized area 22, typically with gold eutectic solder. Although transistor 10 illustrates the use of a die 14 having only 8 cells 14*a*–14*h*, the limitation illustrated is for the purpose of description only. The number of transistor cells which may be present in transistor die 14 is a function of the electrical characteristics sought in the transistor 10. The transistor cells 14*a*–14*h* are each comprised of a plurality of elemental transistors, typically silicon of NPN conductivity type. Preferably, each cell 14*a*–14*h* has a power rating in the range of 1–2 watts. It should be understood that the transistor cells 14*a*–14*h* could be fabricated of semiconductor materials other than silicon such as, for example, germanium, and that they may be doped to be of a PNP conductivity type. Transistor die 14 is produced by methods known in the semiconductor art. The body of the transistor die 14 constitutes the common collector of all the transistor cells 14*a*–14*h* (and, therefore, all of the elemental transistors within each cell). By securing transistor die 14 to metallized region 22, the common collector region is placed in electrical contact with the collector terminal 25**.

Figure 3:
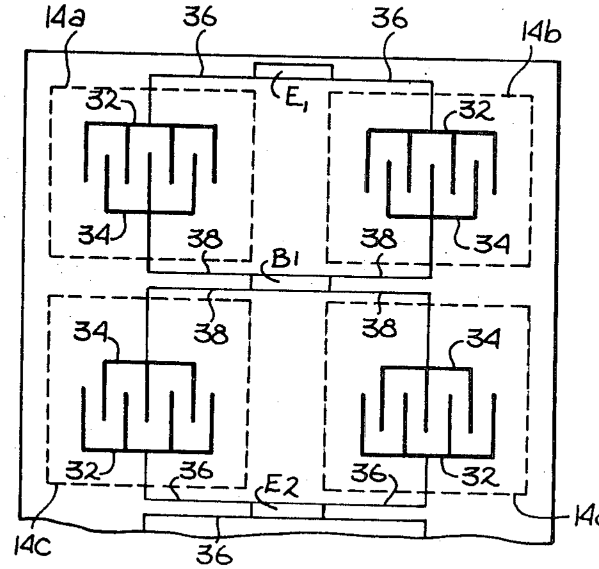
FIG. 3 is an enlarged, top plan view of a portion of the transistor die shown within the partial ellipse 3—3 in FIG. 1.

FIG. 3 shows an enlarged, top plan view of the portion of transistor die 14 shown within the partial ellipse 3—3 in FIG. 1, to wit: transistor cells 14*a*–14*d*. Electrical contact to the active regions within the cells 14*a*–14*d* is made by disposing metallized layers 32 and 34 on the finger-like emitter and base regions, respectively. The common emitter and base regions within each cell 14*a*–14*d* are, in turn, interconnected by additional metallized layers 36 and 38, respectively, so as to form a plurality of common base sites $B_1$ and $B_2$ and common emitter sites $E_1$, $E_2$ and $E_3$ in an alternating pattern along the approximate centerline of transistor die 14. Metal layers 32, 34, 36 and 38 are made of a conventional contact metal such as gold or aluminum and are disposed upon the transistor die by conventional methods, such as vacuum evaporation, to form the interconnecting topological geometry depicted in FIG. 3.

With reference again to FIG. 1, the remaining elements of transistor 10 are described. Base lead bond 44*a* and 44*b* are electrically connected between base sites $B_1$ and $B_2$ and symmetrically located points 46*a* and 46*b* on base terminal 28, respectively. Base lead bonds 44*a* and 44*b* are of substantially equal length and uniform shape. The connections are typically made by thermal compression bonding. In order to minimize the parasitic inductance introduced by base lead bonds 44*a* and 44*b*, the latter should be kept as short as possible. Capacitors 16*a* and 16*b* are connected between the base terminal 28 and symmetrically disposed points 48*a* and 48*b* located on the metallized area 24; i.e., the emitter region disposed between the ground terminals 26*a* and 26*b*. Capacitors 16*a* and 16*b* are connected to the input terminal at points very close to points 46*a* and 46*b* thereon. Lead bond pair 50*a* connects capacitor 16*a* to input terminal 28 while lead bond pair 52*b* connects capacitor 16*b* thereto. Lead pairs are preferred in order to reduce the inductance introduced by such lead bonds in series with capacitors 16*a* and 16*b*. The series inductance of a tingle lead bond could cause series resonance within the operating frequency band of transistor 10. Capacitors 16*a* and 16*b* may be any high Q ceramic microminiature capacitor which can meet the physical constrains of transistor package 12. The present invention also contemplates MOS, MOM and thin-film capacitors or other materials which are capable of meeting the size, power, Q and capacity requirements of the present invention. Lastly, emitter sites $E_1$, $E_2$ and $E_3$ on transistor die 14 are electrically connected to symmetrically located points 50*a*, 50*b* and 50*c* on bridge 30 by emitter lead bonds 52*a*, 52*b* and 52*c*, respectively. The emitter lead bonds are of equal length, uniform shape and as short as possible in order to minimize their respective parasitic inductances.

The basic transistor package 12 is adapted to receive and hold a suitable cover (not shown) disposed over the lead bonds and other elements of hybrid transistor 10 to protect them from the outside environment. The cover is typically a hard plastic material.

With reference to FIG. 2, a schematic representation of the embodiment 10 shown in FIG. 1 is presented. Inductors $L_1$ and $L_2$ symbolically represent the inductances of base lead bonds 44*a* and 44*b*, respectively; capacitors $C_1$ and $C_2$, the capacitors 16*a* and 16*b* respectively; and inductors $L_3$ and $L_4$, the inductances of emitter lead bonds 52*a*–52*c*. Transistors $T_1$ and $T_2$ symbolically represent the transistor die 14. Points 54 and 56 represent the input and collector terminals respectively, while the conventional ground symbol represents the split ground terminals. Capacitors $C_1$ and $C_2$, in combination with inductors $L_1$ and $L_2$ form the first sections of impedance matching and transformation networks. The capacitors $C_1$ and $C_2$ are selected so that, preferably, the latter network sections resonate at the highest frequency of the desired operating band of the transistor 10, thereby, effectively tuning out inductances $L_1$ and $L_2$ and reducing the Q of the device to a value in the range from 1–2. In addition, a relatively low, broad-band impedance transformation is achieved by the network sections formed by $C_1$, $L_1$ and $C_2$, $L_2$, respectively.

The physically symmetrical configuration of transistor 10 results in a substantially uniform distribution of energy through the transistor die 14. Thus, by virtue of the split ground configuration, the two capacitors 16*a* and 16*b*, and the uniformity of lead bonds and their symmetrical placement, a balanced circulation of current through each half of the transistor 10 takes place. As a result, improved heat dissipation takes place, enhancing the capability of the present invention 10 to operate reliably at high power levels. In addition, the use of two capacitors 16*a* and 16*b* is preferred because there is less loss and less parasitic inductance with two capacitors as compared to only one.

Embodiment 10 of the present invention can provide broad-band high frequency performance at power levels from 20–30 watts at UHF frequencies and 5–10 watts at microwave frequencies. In order to increase the power capability from 30 watts to levels in excess of 40 watts, the use of larger transistor dies having lower overall base resistances $R_b'$ is required. The larger dies, of course, provide more transistor cells and, thereby, higher current handling and power dissipation capability. The design technique is to provide more cells in parallel. However, the mere interconnection of these cells to a common emitter and a common base site on the transistor die and the use of single lead bonds to connect these sites to ground and input terminals, as has been the practice of the prior art, is inadequate.

Firstly, the inductance introduced by the base lead bond and by the interconnecting metallized layers substantially reduce the bandwidth which is attainable by the device. Equation 1 presents the relationship defining the bandwidth limitation of a power transistor implemented through the direct coupling of the base regions of the transistor elements making up the high frequency, high power transistor:

$$BW_{\text{input}} = R_b'/2\pi L_{\text{input}} \quad (1)$$

where $R_b'$=base resistance
where $L_{\text{input}}$=inductance of base lead bond While the use of impedance matching networks can make the input impedance substantially flat over the bandwidth of the device, a bandwidth extension beyond that set forth in Equation 1 is physically impossible. Given the relationship set forth in Equation 1, it is possible to increase the base resistance $R_b'$ to increase bandwith, but this is impracticable since a good high frequency performance requires low base resistance and a high power rating. Since it is a generally accepted principle that each time the output power of a transistor is to be doubled, the base resistance $R_b'$ must be divided by two. As a result, the parameter which must be modified is the input inductance $L_{in}$ which in this case is primarily the inductance of the lead bond between the base site on the transistor die and the base terminal of the transistor package.

Another limitation inherent in attempting to achieve high power capacity by merely interconnecting a parallel array of transistor cells relates to the critical requirement that the input energy be distributed uniformly through the multiple transistor cells. Each transistor cell has a given base resistance which, when the transistor is driven in a Class "C" mode, tends to become smaller as the input energy is increased. If for any reason the base resistance of any of the direct coupled transistor cells presents a lower resistance to the driving signal than any of the other transistor cells, the power dissipated through the cell having the lower base resistance will increase. Since the base spreading becomes smaller as the input energy increases, the power dissipated in the cell having the lower base resistance increases even further, causing a substantial imbalance in the distribution of the input energy through the transistor cells, and possibly a thermal runaway condition.

A second preferred embodiment of the present invention, described with reference to FIGS. 4–7, overcomes the limitations of bandwidth and energy distribution imbalance and makes possible broad-band high frequency performance at power levels above 40 watts. With an appropriate conventional external impedance matching network, high power performance is attainable across one octave of the frequency band above 100 mHz. The novelty of this second preferred embodiment lies in its use of multiple base and emitter sites on the transistor die and their electrical isolation by internal capacitors which, in combination with the inductances of the base lead bonds, act as effective quarterwave transmission lines between the input terminal and each base site.

Referring to FIGS. 4–7, this second preferred embodiment of the present invention, generally designated therein by the reference numeral 60, is now described in detail. Like hybrid transistor 10, the first preferred embodiment of this invention, transistor 60 is comprised of a basic transistor package 62, transistor die 64, and a capacitor array 66.

Figure 4:
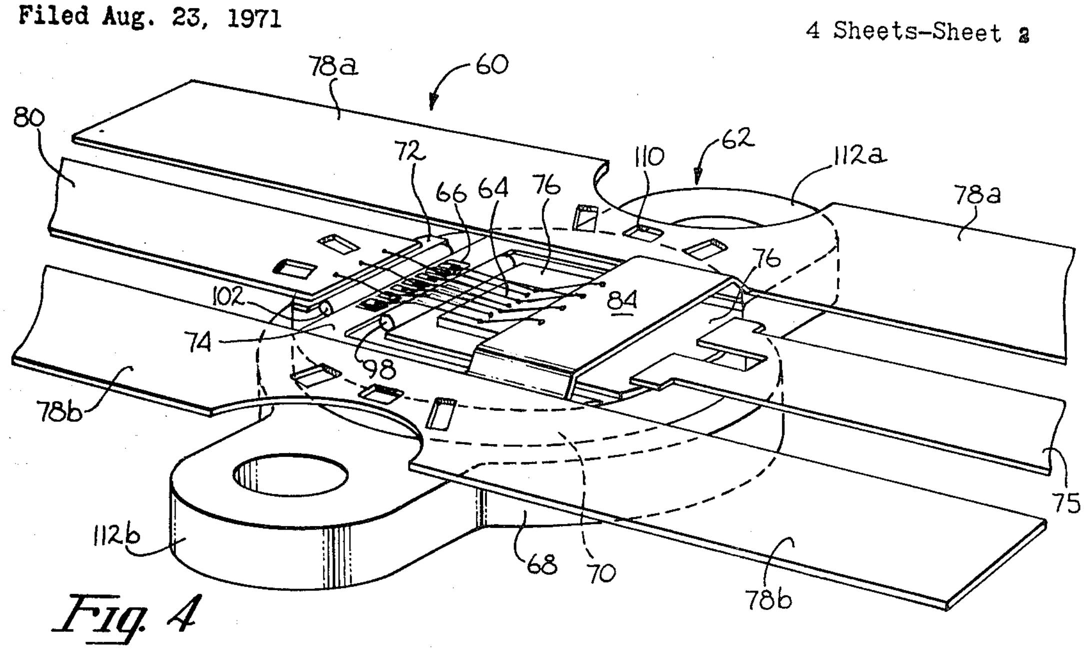
FIG. 4 is a front, perspective view of a second preferred embodiment of a hybrid transistor in accordance with the present invention.
Figure 5:
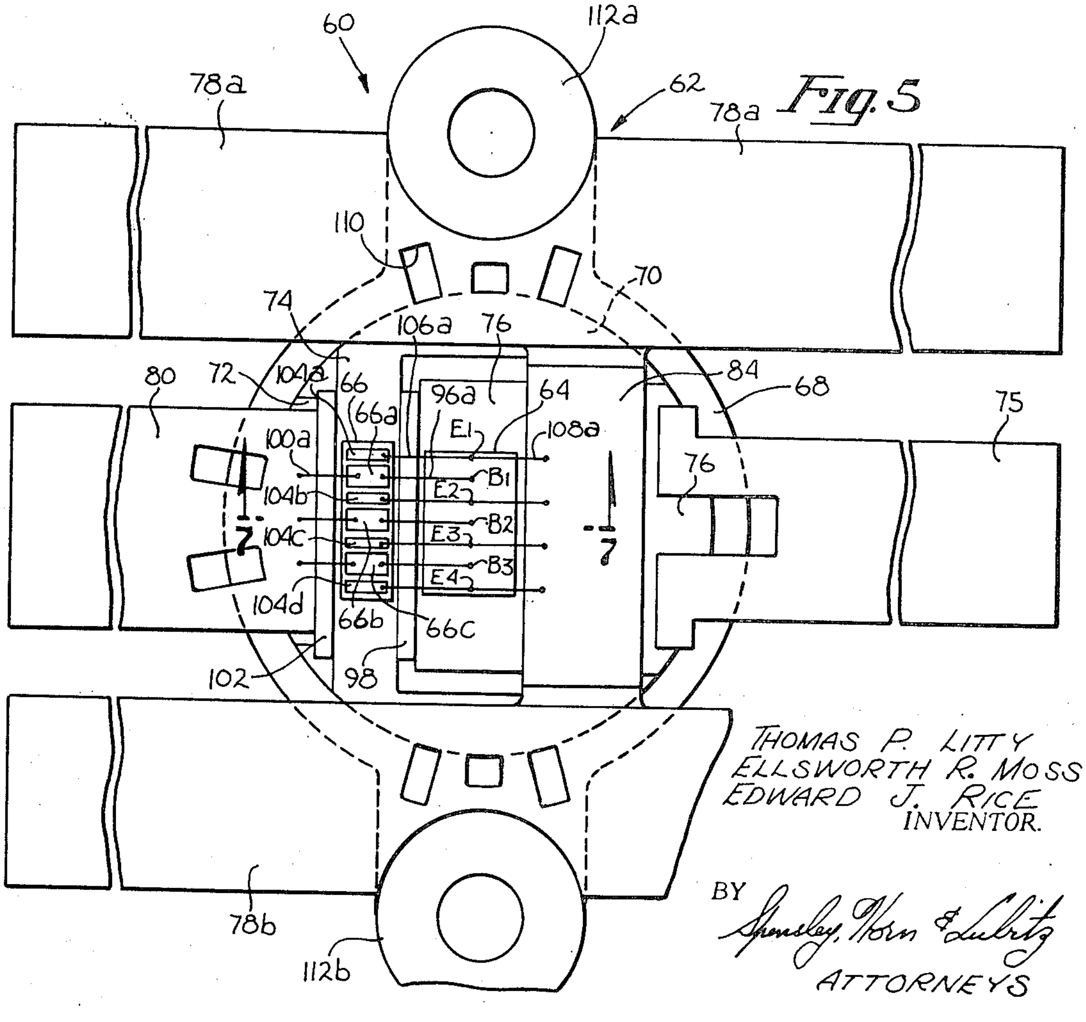
FIG. 5 is a top plan view of the hybrid transistor shown in FIG. 4.
Figure 7:
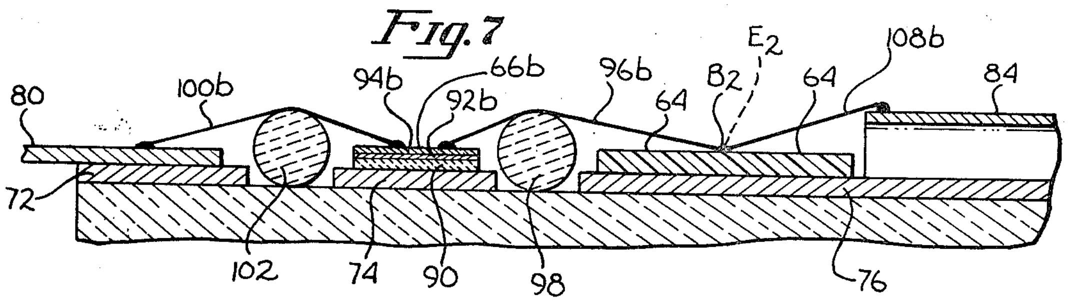
FIG. 7 is a cross-sectional view of the embodiment shown in FIG. 4 taken along lines 7—7.

The basic transistor package 62 is substantially similar to the transistor package 12 described hereinabove with respect to hybrid transistor 10. Transistor package 12 is comprised of a main body 68 having disposed upon, and fixed to its top surface, a ceramic member 70. Metallized areas 72, 74 and 76 are deposited over the portions of ceramic member 70 as shown in FIGS. 4, 5 and 7. Collector terminal 75 is attached to the metallized area 76; a pair of ground terminals **78*a* and 78*b* are attached to metallized area 74; and an input terminal 80 is attached to metallized area 72. A bridge 84, passing over metallized area 76 also connects ground terminals 78*a* and 78*b***. Although a common emitter configuration is disclosed, it should be understood that the present invention is not limited to this configuration, a common base configuration also being contemplated and operable.

Transistor die 64 is a multicell element similar to that shown in FIG. 3. It has a sufficient number of transistor cells interconnected by conventional metallized contact metal to provide the current handling and power dissipation capacity desired. For the purpose of illustration only, three base sites $B_1$, $B_2$ and $B_3$ and four emitter sites $E_1$, $E_2$, $E_3$ and $E_4$ are shown on transistor die 64. The body of transistor die 64 constitutes the common collector of all the transistor cells. By securing transistor die 64 to metallized area 76, the common collector region of the die 64 is placed in electrical contact with the collector terminal 75.

In hybrid transistor 60, an MOS capacitor array 66 is deposited on metallized area 74. The array 66 in this preferred embodiment is comprised of three capacitors **66*a*, 66*b* and 66*c*. The capacitor array 66** is produced by MOS techniques known in the art. It should be understood that the use of an MOS capacitor array having three capacitors is for the purpose of example only, other suitable capacitors, one or more in number, being contemplated by this invention.

The structure of the capacitor array 66 can be best seen in the cross-sectional view of FIG. 7. A substrate of silicon 90 is disposed upon metallized layer 74, the substrate of silicon 90 serving as a common plate of all of the capacitors **66*a*–66*c*. Silicon substrate 90 is typically heavily doped and of N+ conductivity type; typically, it is secured to the layer 74 by a gold eutectic solder. Since metallized area 74 is in contact with the ground terminals 78*a* and 78*b*, the bottom plates of the capacitor 66*a*–66*c* are coupled to the split ground of the device 60 through the relatively small resistance of the silicon layer 90. Layers of a silicon dioxide 92*a*–92*c* (only 92*b* is shown in FIG. 7) are deposited on the upper surface of silicon substrate 90, silicon dioxide layers 92*a*–92*c* comprising the dielectric for capacitors 66*a*–66*c*, respectively. On the upper surface of each layer of silicon dioxide 92*a*–92*c*, layers of metal 94*a*–94*c*, typically aluminum, are deposited to form the upper plates of capacitors 66*a*–66*c***, respectively.

With reference again to FIGS. 4–5, as well as FIG. 7, the remaining elements of hybrid transistor 60 are described. For convenience, the interconnections will be described with reference to base site $B_1$ and emitter site $E_1$ only, it being understood that the same description is applicable with respect to the other base and emitter sites. Base lead bond **96*a* interconnects base site $B_1$ to upper plate 94*a* of capacitor 66*a*. The base lead bonds between the base sites $B_1$–$B_3$ and the capacitor array 66 are of substantially equal length, uniform shape and as short as possible. To ensure uniformity of their length and shape, these base lead bonds are passed over and contact a first glass rod 98 disposed in a trough between metallized areas 74 and 76. Upper plates 94*a* of capacitor 66*a* is connected to base terminal 80 by means of base lead bond 100*a*. The lead bonds connecting capacitors 66*a*–66*c* to base terminal 80 are connected thereto at symmetrically located points close to the inward edge of base terminal 80, as shown in FIGS. 4–5. These lead bonds are also of equal length and as short as possible. Uniformity of length and shape is ensured by passing them over a second glass rod 102 disposed in a trough between metallized areas 72 and 74**.

Deposited upon the layer of silicon 90 within capacitor array 66 are four "ground stripes" **104*a*–104*d* made of strips of metal, such as aluminum. Ground stripes 104*a*–104*d* are deposited in an alternating pattern with capacitors 66*a*–66*c* as shown in FIG. 5 and are coupled to the common ground of the device 60 through the silicon substrate 90. Emitter lead bond 106*a* connects emitter site E, to ground stripe 104*a*. The emitter lead bond 106*a* passes over glass rod 90 and is substantially of the same length and shapes as base lead bond 96*a*. In addition, the emitter lead bonds such as 106*a* and the base lead bonds such as 96*a* are interleaved and in a parallel spaced relation with respect to each other. As a result of this configuration, there is a reduction of the overall base inductance of the transistor 60** primarily due to the cancellation effects of the currents flowing in opposite directions in the emitter and base lead bonds, respectively.

In order to provide a second set of symmetrical paths for the flow of emitter current from emitter sites $E_1$–$E_4$, the latter are connected to symmetrically located points close to the inward edge of bridge 84 and, thus, to ground terminals **78*a* and 78*b*. For example, emitter site E, is connected to bridge 84 by emitter lead bonds 108*a*. The emitter lead bonds such as 108*a*** are of equal length, uniform shape and usually as short as possible.

All lead bonds are connected to the points indicated hereinabove by conventional bonding techniques, preferably thermal compression bonding.

The elements of hybrid transistor 60 are protected by a cover (not shown) which is adapted to fit through openings or slots 110 in the several terminals and to be secured to the main body 68. Flanges **112*a* and 112*b* are adapted to enable the connection of transistor 60** to an external heat sink.

Figure 6:
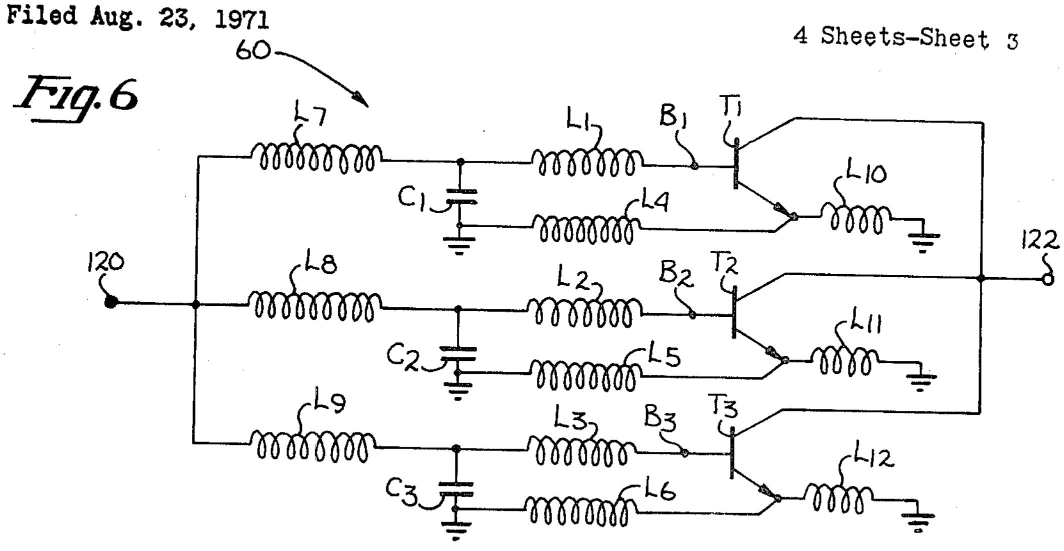
FIG. 6 is a schematic representation of the hybrid transistor shown in FIG. 4.

With reference to FIG. 6, a schematic representation of the embodiment 60 shown in FIGS. 4, 5 and 7 is presented. The discrete components shown in FIG. 6 symbolically represent the following physical elements of transistor 60 described above:

(i) Inductors $L_1$–$L_3$ represent the inductances of base lead bonds **96*a*–96*c***, respectively;

(ii) Inductors $L_7$–$L_9$ represent the inductances of base lead bonds **100*a*–100*c***, respectively;

(iii) Capacitors $C_1$–$C_3$ represent capacitors **66*a*–66*c***, respectively;

(iv) Inductors $L_4$–$L_6$ represent the inductances of the emitter lead bonds **106*a*–106*d***;

(v) Inductors $L_{10}$–$L_{12}$ represent the inductances of the emitter lead bonds **108*a*–108*d***;

(vi) Transistors $T_1$–$T_3$ represent the multicell transistor die 64 (the number of transistors shown is for the purpose of example only); and (vii) Points 120 and 122 represent the input and collector terminals 80 and 75, respectively, while the conventional ground symbol represents the split ground terminals 78.

It can be seen that transistors $T_1$–$T_3$ are interconnected in a manner adapted to facilitate the fabrication of a large transistor package, the bases of which transistors are each connected to a common input terminal 120 through the L, C network shown in FIG. 6; e.g., with respect to transistor $T_1$, the network comprised of inductors $L_1$ and $L_7$ and capacitor $C_1$. Each of the L, C networks operates as an effective quarterwave transmission line between the base terminal 120 and the base of each transistor $T_1$–$T_3$.

The relationship between the input impedance of a quarterwave transmission line and the characteristic impedance and terminating impedance thereof is set forth as follows:

$$Z_{in}=\frac{Z_t \cos \beta(\lambda/4)+jZ_o \sin \beta(\lambda/4)}{Z_o \cos \beta(\lambda/4)+jZ_t \sin \beta(\lambda/4)}$$

where $\beta=2\pi/\lambda$, and $\lambda$=wavelength therefore:

$$Z_{in}=Z_o\frac{Z_t \cos (2\pi/4)+jz_o \sin (2\pi/4)}{Z_o \cos (2\pi/4)+jz_t \sin (2\pi/4)} \quad (3)$$

Rearranging terms and solving for $Z_o$, the characteristic impedance of a quarterwave transmission line is represented by the expression set forth in Equation 4;

$$Z_o=\sqrt{Z_{in}Z_t} \quad (4)$$

where $Z_o$=characteristic impedance of the quarterwave transmission line $Z_{in}$=input impedance of transmission line $Z_t$=terminating impedance Again by rearranging the terms of Equation 4, it can be seen that:

$$Z_{in}=Z_o^2/Z_t \quad (5)$$

Thus, since transistors $T_1$, $T_2$ and $T_3$ are each connected to input terminal 120 through effective quarterwave transmission lines, the input impedance ($Z_{in}$) at the input of each of the effective transmission lines is inversely proportional to the terminating impedance $Z_t$. Since the base resistance $R_b'$ of each transistors $T_1$–$T_3$ is the terminating impedance of the effective transmission line to which it is connected, any reduction in base resistance $R_b'$ of a particular transistor T will cause an increase in the input impedance of its corresponding transmission line. The increase in the input impedance of the effective transmission line results in a decrease of input energy to the particular transistor T, wherein the base resistance decreased (for whatever reason), instead of an increase as would be the case without a transmission line. Thus, a self-regulating mechanism is introduced by the configuration of hybrid transistor 60, substantially eliminating the cause for energy distribution imbalance and thermal runaway and their adverse effect upon transistor reliability.

The use of an actual quarterwave transmission line within transistor package 60 is physically impossible because of the relative dimensions of same. For example, a high frequency, high power transistor, designed to operate over a frequency range of 200–400 mHz. with a middle frequency of 300 mHz, would require a quarterwave transmission line, at the middle frequency, 25 centimeters in length. However, by means of the present invention, i.e., by utilizing the inductances of the base lead bonds and the internal capacitors as shown schematically in FIG. 6, it is possible to develop an effective quarterwave transmission line between the base terminal 80 and the base sites $B_1$–$B_3$. To accomplish this, the present invention teaches (i) making base lead bonds such as 96*a* approximately equal in length to base lead bonds such as 100*a* and (ii) the use or fabrication of capacitors 66*a*–66*c* which are resonant with the inductances introduced by the aforementioned base lead bonds, preferably at the highest frequency of the band at which the invented transistor 60 is to operate. In this manner, the L, C networks shown in FIG. 6 simulate quarterwave transmission lines between the input terminal 80 and the bases of transistors $T_1$–$T_3$, providing the advantageous results described above.

Where the invented transistor 60 is to operate at frequencies of approximately 200–425 mHz., the length of base lead bonds such as 96*a* are typically in the range of 70–100 mils. At microwave frequencies, base lead bonds such as 96*a* are decreased in length to approximately 40 mils. As stated above, base lead bonds such as 100*a* are equal in length to base lead bonds such as 96*a* and, therefore, have the same inductance. The inductances provided by lead bonds of the lengths described are commensurate with the characteristic impedance required to simulate effective quarterwave transmission lines.

A further advantage of the invented transistor 60 lies in its achieving a broader bandwidth. Referring again to Equation 1, it is noted that the bandwidth of a power transistor is inversely proportional to the inductance of its base lead bonds. As can be seen in FIGS. 5–6, the segments of base lead bonds such as 96*a* and 100*a* are shorter on either side of capacitor array 66 than would be the case in a conventional transistor of comparable size. Since the capacitors 66*a*–66*c* effectively tune out the inductances introduced by the base lead bonds such as 96*a*, only the inductances of the relatively short base lead bonds such as 100*a*, extending between the capacitor array 66 and the input terminal 80, are left. Since shorter base leads introduce less parasitic inductance, a substantial increase in the bandwidth of transistor 60 is achieved in accordance with Equation 1. In addition, there is less inductance in base lead bonds, such as 96*a*, which is required to be tuned out. It should be understood, however, that the present invention is not limited to broadband operation. In fact, use of the principles of the present invention in narrow-band transistor applications will provide substantially improved performance over comparable transistors of the prior art because of the lower impedance transformation which occurs within the internal L, C networks.

As was true of the first preferred embodiment 10 of the present invention, shown in FIG. 1, the second preferred embodiment 60 also has a highly symmetrical configuration of elements and lead bonds. As a result, a substantially uniform distribution of energy through the device 60 is achieved.

Although invented transistor 60 represents a significant advance over the prior art, the inductance of the base lead bonds, such as 100*a*, connecting the capacitors 66*a*–66*c* to the input terminal 80, plus the inductances of the terminal 84 and the external wiring are, in combination, too large to maintain the bandwidth gained by the placement of capacitor array 66 within the basic transistor package 62 as described hereinabove. The VSWR of the device becomes too high at the lower frequencies of the band. High frequency performance across one octave of the band would still require the use of the appropriate external matching neworks such as, for example, quadrature combiners. In a third preferred embodiment of the present invention, a single ended broad-band high power transistor is disclosed, providing high frequency performance over one octave of the band without the use of external matching networks. This is achieved by including within the hybrid transistors, such as that shown in FIGS. 4–5, a pair of symmetrically disposed capacitors between the input terminal and the common ground terminals. The capacitors form a second matching section which tunes out the inductances of the base lead bonds between the input terminal and the capacitors of the first matching section (in FIG. 5, for example, base lead bonds such as 100*a*). The value of the capacitors is selected so that resonance occurs in the second matching network, preferably at the highest frequency of the operating band of the device.

Figure 8:
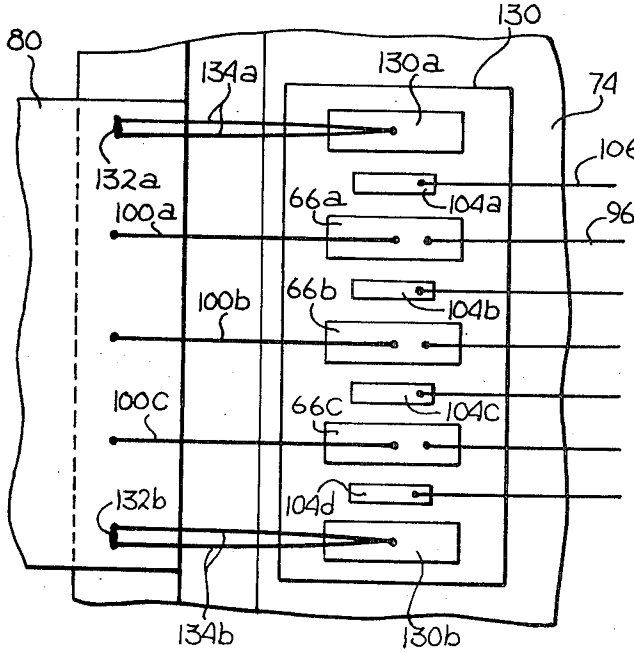
FIG. 8 is a top plan view of a portion of a third preferred embodiment of a hybrid transistor in accordance with the present invention.

The pair of input terminal capacitors can be any suitable ceramic capacitor installed in a manner similar to that shown in FIG. 1 with reference to hybrid transistor 10. In embodiments of the present invention utilizing an MOS capacitor array, such as hybrid transistor 60, the pair of input terminal capacitors can be additional capacitors on the capacitor array 66 shown in FIG. 5. Such a configuration is described with reference to FIG. 8 where a capacitor array 130 is shown. Capacitor array 130 is identical to capacitor array 66 except for the addition of capacitors 130*a* and 130*b* at each end of the array 130. For convenience in correlating elements shown in FIG. 8 with elements in FIG. 5, like parts will be designated by the same numerals. Capacitors 130*a* and 130*b* are disposed symmetrically with respect to input terminal 80 and capacitor array 130, and are connected to input terminal 80 at points 132*a* and 132*b* which are symmetrically located thereon close to its inward edge. Lead bond pair 134*a* connects capacitor 130*a* to input terminal 80, while lead bond pair 134*b* connects capacitor 130*b* thereto. Lead bond pairs are preferred in order to reduce the series inductance which could cause series resonance within the operating frequency band of the device.

Figure 9:
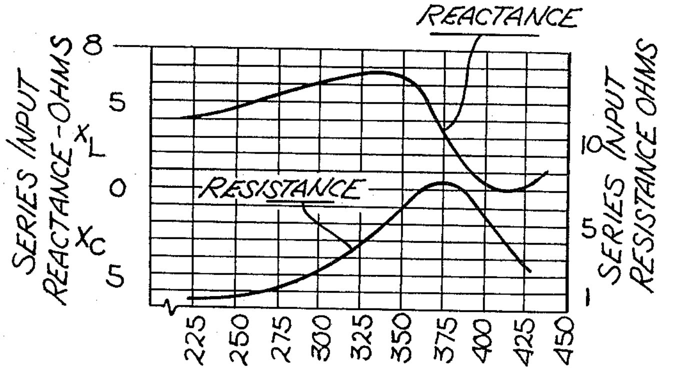
FIG. 9 is a graph comparing frequency versus input reactance and input resistance of one form of the present invention.
Figure 10:
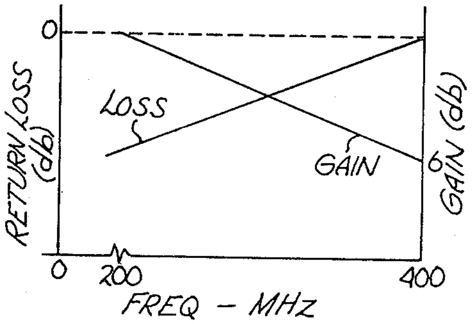
FIG. 10 is a graph comparing frequency versus gain and return loss of one form of the present invention.

Referring now to FIGS. 9 and 10, typical electrical characteristics of a hybrid transistor fabricated in accordance with the present invention can be seen. Referring first to FIG. 9, a pair of curves respectively comparing series input reactance versus frequency and series input resistance versus frequency are shown. For the purpose of example, the characteristics of a hybrid transistor designed to operate over a frequency range of approximately 225–425 mHz. are shown. It can be seen that at a frequency of approximately 412 mHz. the input impedance to the transistor is purely resistive, all reactive components having been resonated out by the first section of matching network schematically depicted in FIG. 2.

The ability of the invented hybrid transistor to maintain a substantially constant power output over the operating frequency range can be best seen by reference to FIG. 10 wherein typical curves are shown comparing frequency and return loss and frequency and power gain of the device. It is a well known principle that as the frequency of the input signal to a transistor is doubled (an increase of 1 octave), there is a decrease in gain of 6 db. As can be seen from FIG. 9, the input impedance of the present invention transistor package is tuned at substantially the highest frequency within the operating bandwidth of the device so that the input impedance to the device is resistive (zero reactance). At lower frequencies within the operating bandwidth, the VSWR will increase, i.e., there will be an increased reflection of a portion of the input signal energy presented to the transistor. By appropriate selection of the internal capacitors disclosed by the present invention, the loss of input energy due to increasing VSWR can be effectively cancelled by the increasing rate of gain of the transistor, and vice-versa, over the full operating bandwidth. As a result, the output power of the present invention can be made substantially constant over its operating bandwidth. It should be noted that at this point that if the present invention is applied in a transistor designed for operation below 15 watts, the use of a suitable broad-band external matching network would yield a VSWR of less than 1.5 to 1.0; i.e., a nearly perfect transistor having a low, flat VSWR across one octave of the high frequency band.

Figure 11:
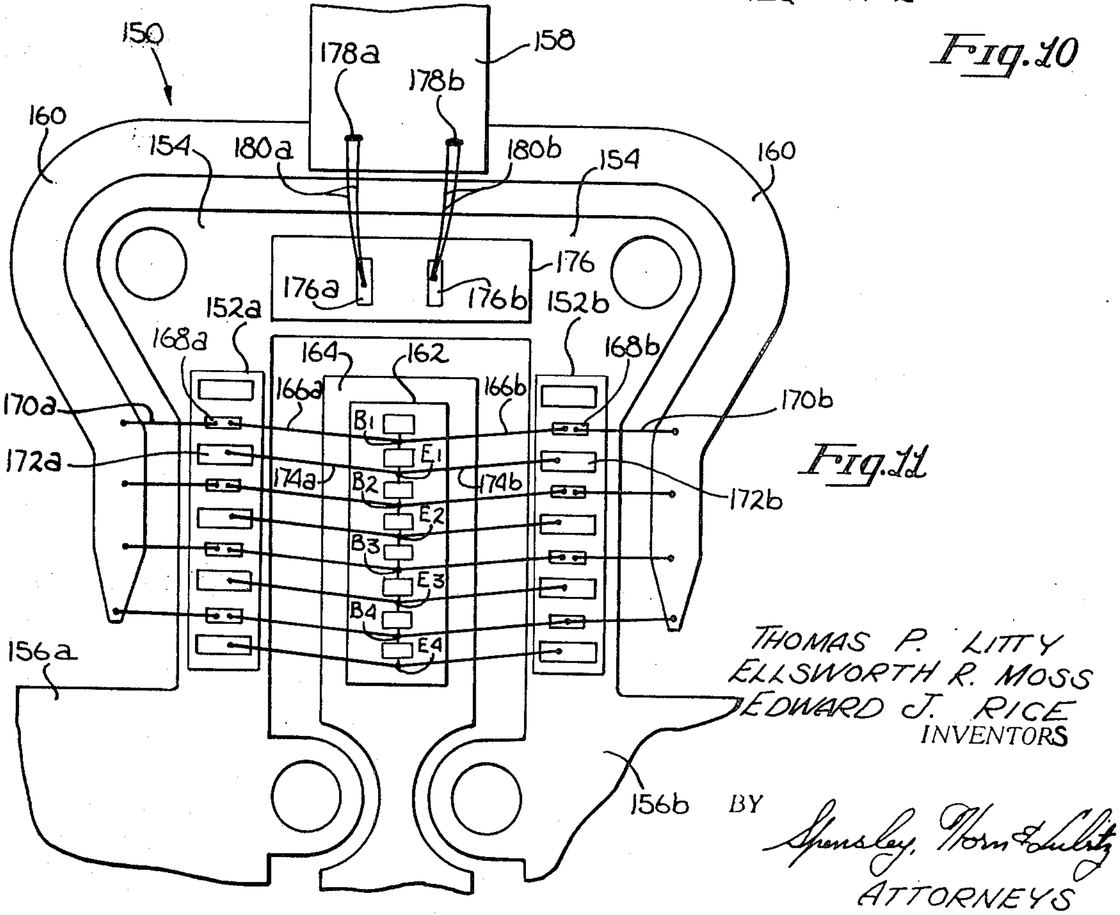
FIG. 11 is a top plan view of a fourth preferred embodiment of a hybrid transistor in accordance with the present invention, suitable for use in the microwave portion of the frequency band.

With reference to FIG. 11, a fourth preferred embodiment is described, the invented hybrid transistor shown therein being generally designated by the reference numeral 150. Hybrid transistor 150 is adapted to operate at high power levels in the microwave band. The symmetrical configuration of elements depicted in FIG. 11 is the essential characteristic of this embodiment. A pair of MOS capacitor arrays 152*a* and 152*b* are disposed upon and secured to a metallized area 154, the latter area being joined to common ground terminals 156*a* and 156*b*. An input terminal 158 is affixed to a third metallized area 160. Multicell transistor die 162, having a plurality of emitter sites $E_1$–$E_4$ and base sites $B_1$–$B_4$ in an alternating pattern down its centerline, is disposed upon and secured to a metallized area 164 which serves as a common collector region. A collector terminal (not shown) is affixed to metallized area 164. For convenience, the interconnection will be described with reference to base site B, and emitter site $E_1$ only, it being understood that the same description is applicable to the others. Base lead bonds 166*a* and 166*b* connect base site $B_1$ to the upper plates of MOS capacitors 168*a* and 168*b* on capacitor arrays 152*a* and 152*b*, respectively. The upper plates of capacitors 168*a* and 168*b* are, in turn, connected to metallized area 160 (and thus to input terminal 158) by base lead bonds 170*a* and 170*b*, respectively. Emitter site $E_1$ is connected to ground stripes 172*a* and 172*b* on arrays 152*a* and 152*b*, respectively, by emitter lead bonds 174*a* and 174*b*, respectively. Ground stripes 172*a* and 172*b* are coupled to the metallized area 154 through the relatively low resistance of heavily doped silicon substrate (not shown) as described hereinabove with reference to FIG. 7. The lengths and shapes of all lead bonds shown in FIG. 11 are substantially equal and uniform and as short as possible to minimize lead bond inductance.

Capacitors 168*a* and 168*b* form, in combination with the inductances of base lead bonds 166*a* and 166*b*, first impedance matching sections which, by the appropriate selection of capacitor values, are tuned at the highest frequency of the operating band of the device 150. Second impedance matching networks are formed internally by two input terminal capacitors 176*a* and 176*b* symmetrically located on a third MOS capacitor array 176 disposed upon and secured to metallized area 154. Upper plates of 176*a* and 176*b* are connected to symmetrically located points 178*a* and 178*b* near the inward edge of input terminal 158 by pairs of base lead bonds 180*a* and 180*b*, respectively. As in other embodiments of the present invention, pairs of base lead bonds 180*a* and 180*b* are preferred in order to reduce the inductances in series with the input terminal capacitors 176*a* and 176*b*. The capacitors 176*a* and 176*b*, in combination with the inductances of base lead bonds 170*a* and 170*b*, form second internal impedance matching sections which, by the appropriate selection of capacitor values, are tuned at the highest frequency of the operating band. The result is a high power, hybrid transistor having very low input Q, low impedance transformation, lower power losses and substantially uniform gain over a broad band of the microwave region of the RF spectrum. In addition, the fact that the internal impedance matching network appears as an effective quarterwave transmission line between each base site $B_1$–$B_4$ and the input terminal 158 substantially eliminates a cause of high power transistor failure, namely energy distribution imbalance and thermal runaway, as explained more fully hereinabove.

It should be understood that the present invention does not necessarily require integrated circuit technology or silk screen techniques. It involves conventional semiconductor technology to build the circuit elements; i.e., the transistor die and the MOS capacitors, if the latter are the type used. The flexibility with which the present invention can be practiced by those skilled in the art to which it pertains enables the design of hybrid transistors capable of meeting the requirements of virtually any application. As has been stated hereinabove, the present invention also has the significant advantage of improved reliability and reproducibility. The reproducibility of the present invention, i.e., of the factory controlled first and/or second internal impedance matching sections, is substantially better than that attainable by the use of external matching networks and conventional transistors.

Although this invention has been disclosed and described with reference to particular embodiments, the principles involved are susceptible of other applications which will be apparent to persons skilled in the art. This invention, therefore, is not intended to be limited to the particular embodiments herein disclosed.

We claim:

1. An electrical translating device comprising:
(a) a thermally conducting, electrically insulating member having first, second and third electrically conducting surfaces disposed thereon in spaced relation with each other, said second conducting surface having a portion thereof intermediate said first and third conducting surfaces;
(b) a semiconductor die disposed upon said first conducting surface, said die having at least one each of first, second and third active regions and being arranged and constructed so that said first active region makes electrical contact with said first conducting surface;
(c) at least one capacitive element having first and second plates, said first plate being electrically coupled to said portion of said second conducting surface intermediate said first and third conducting surfaces;
(d) first means for electrically coupling said second active region to said second plate of said capacitive element;
(e) second means for electrically coupling said second plate of said capacitive element to said third conducting surface; and
(f) third means for electrically coupling said third active region to said second conducting surface.

2. The device of claim 1 wherein the numbers of said first, second and third active regions of said semiconductor die are greater than one respectively, and the number of said capacitive elements is greater than one.

3. The device of claim 1 wherein said first, second and third active regions of said semiconductor die are transistor collector, base and emitter regions, respectively.

4. The device of claim 1 wherein said first, second and third active regions of said semiconductor die are transistor collector, emitter and base regions, respectively.

5. The device of claim 1 having in addition thereto fourth means for electrically coupling said third active region to said portion of said second conducting surface intermediate said first and third conducting surfaces.

6. The device of claim 5 wherein said first, second, third and fourth means are lead bonds.

7. The device of claim 1 wherein said capacitive element is an MOS capacitor comprising:
(i) a first plate fabricated of a highly doped substrate of silicon of N+ conductivity type, said first plate being disposed upon said portion of said second conducting surface intermediate said first and third conducting surfaces;
(ii) a layer of silicon dioxide disposed upon said substrate of silicon, said layer being the dielectric of said MOS capacitor; and
(iii) a second plate fabricated of a conducting metal, said second plate being disposed upon said layer of silicon dioxide.

8. The device of claim 7 having in addition thereto at least one stripe of conducting metal disposed upon said substrate of silicon and fourth means for electrically coupling said third active region of said semiconductor die to said stripe.

9. The device of claim 8 wherein the number of said stripes of conducting metal is greater than one and the number of said third active regions is greater than one.

10. The device of claim 1 wherein the reactances of said capacitive element and of said first and said second means are substantially equal at the highest frequency in the operating band of said device.

11. The device of claim 1 having in addition thereto:
(i) at least one input capacitive element, said input capacitive element having first and second plates, said first plate thereof being electrically coupled to said portion of said second conducting surface intermediate said first and third conducting surfaces; and
(ii) fourth means for electrically coupling said second plate of said input capacitive element to said third conducting surface.

12. The device of claim 11 wherein the number of said input capacitive elements is greater than one and said input capacitive elements are disposed in a symmetrical spaced relation with respect to said second and third conducting surfaces.

13. The device of claim 11 wherein said fourth means is a pair of lead bonds.

14. The device of claim 11 wherein said capacitive element and said input capacitive element are MOS capacitors comprising:
(i) a common first plate fabricated of a highly doped substrate of silicon of N+ conductivity type, said first plate being disposed upon said portion of said second conducting surface intermediate said first and third conducting surfaces;
(ii) at least two layers of silicon dioxide disposed upon said substrate of silicon, said layers being the dielectrics of said MOS capacitors; and
(iii) at least two layers of conducting metal disposed upon said layers of silicon dioxide respectively, said layers of conducting metal being the second plates of said MOS capacitors.

15. The device of claim 11 wherein the reactances of said input capacitive element and said second means are substantially equal at the highest frequency in the operating band of said device.

16. A hybrid transistor comprising:
(a) a thermally conducting, electrically insulating member having first, second and third metallized surfaces disposed thereon in spaced relation with each other, said second metallized surface having a first portion thereof intermediate said first and third metallized surfaces and a second portion thereof disposed in elevation over said first metallized surface;
(b) a multicell transistor die disposed upon said first conducting surface, said die having a plurality of collector, emitter and base regions and being arranged and constructed so that said collector regions make intimate electrical contact with said first conducting surface, said emitter regions are interconnected to a plurality of emitter sites and said base regions are interconnected to a plurality of base sites;
(c) a plurality of capacitive elements, each having first and second plates, said first plates being in electrical contact with said first portion of said second metallized surface intermediate said first and third metallized surfaces, the number of said capacitive elements exceeding the number of said base sites by two, said two being first and second capacitive elements;
(d) a plurality of first lead bonds, each of said first lead bonds connecting one of said base sites to one of said second plates of said capacitive elements, respectively, except those of said first and second capacitive elements;
(e) a plurality of second lead bonds, each of said second lead bonds connecting one of said second plates of said capacitive elements, except those of said first and second capacitive elements, to said third metallized surface, respectively, the length of said second lead bonds being substantially equal to that of said first lead bonds;

(f) first and second pairs of lead bonds connecting said second plates of said first and second capacitive elements to said third metallized surface, respectively; and (g) a plurality of third lead bonds, each of said third lead bonds connecting one of said emitter sites to said second portion of said second metallized surface disposed in elevation over said first metallized surface, wherein the reactances of each of said capacitive elements and each of said first and second lead bonds are substantially equal at the highest frequency in the operating band of said device.

17. The hybrid transistor of claim 16 wherein said base sites and said emitter sites are disposed on the upper surface of said die along the approximate centerline thereof in an alternating pattern.

18. The hybrid transistor of claim 16 having in addition thereto a plurality of fourth lead bonds, each of said fourth lead bonds connecting one of said emitter sites to one of a plurality of points located on said first portion of said second metallized surface intermediate said first and third metallized surfaces, the length of said fourth lead bonds being substantially equal to that of said first lead bonds, said first and fourth lead bonds being disposed in parallel space relation to each other and in an alternating pattern.

19. The hybrid transistor of claim 18 wherein said capacitive elements are MOS capacitors comprising:

(i) a common first plate fabricated of a highly doped substrate of silicon of N+ conductivity type, said first plate being disposed upon said first portion of said second metallized surface intermediate said first and third conducting surfaces;

(ii) a plurality of layers of silicon dioxide disposed upon said substrate of silicon, said layers being the dielectric of said MOS capacitors; and (iii) a plurality of layers of aluminum, each of said layers of aluminum being disposed upon one layer of silicon dioxide, respectively, said layers of aluminum being the second plates of said MOS capacitors.

(iv) a plurality of stripes of aluminum disposed upon said substrate of silicon, said stripes being located intermediate said MOS capacitors in an alternating pattern, each of said fourth lead bonds being connected at one end thereof to one of said stripes.

20. The hybrid transistor of claim 18 having in addition thereto first and second electrically insulating rods, said first rod being disposed in a first trough between said first metallized surface and a first side of said second portion of said second metallized surface, said second rod being disposed in a second trough between said third metallized surface and a second side of said second portion of said second metallized surface, said first and fourth lead bonds being disposed over and in contact with said first rod, and said second lead bonds and said first and second pairs of lead bonds being disposed over and in contact with said second rod.

21. The hybrid transistor of claim 20 wherein said electrically insulating rods are glass.

22. The hybrid transistor of claim 16 wherein said cells of said transistor die comprise a plurality of NPN silicon transistor elements.

23. The hybrid transistor of claim 16 wherein said capacitive elements are disposed in a symmetrically spaced relation with respect to said second and third metallized surface; said second lead bonds are disposed in a parallel space relation to each other and connected to said third metallized surface at points symmetrically located near the inward edge thereof; said first and second pairs of lead bonds are disposed in a symmetrical space relation to each other and connected to said third metallized surface at points symmetrically located near the inward edge thereof; and wherein said third lead bonds are disposed in a parallel space relation to each other and connected to said second portion of said second metallized surface at points symmetrically located near the inner edge thereof.

24. The hybrid transistor of claim 16 wherein said member is a ceramic material.

25. The hybrid transistor of claim 24 wherein said ceramic is beryllium oxide.

26. The hybrid transistor of claim 16 wherein said first, second and third metallized surfaces are fabricated of gold plated covar.

27. The hybrid transistor of claim 16 wherein said first and second lead bonds and said capacitive elements exclusive of said first and second capacitive elements, are arranged and configured to form a plurality of effective quarterwave transmission lines, each of said lines being connected between each of said base sites and said third metallized surface.

28. The hybrid transistor of claim 16 wherein said second metallized surface is arranged and constructed in a split ground configuration.

29. An electrical translating device comprising:

(a) a thermally conducting, electrically insulating member having first, second and third electrically conducting surfaces disposed thereon in spaced relation with each other, said second conducting surface having a portion thereof intermediate said first and third conducting surfaces;

(b) a semiconductor die disposed upon said first conducting surface, said die having at least one first and second active regions and at least two third active regions, said die being arranged and constructed so that first active region makes electrical contact with said first conducting surface;

(c) first and second capacitive elements having first and second plates, said first plates thereof being electrically coupled to said portion of said second conducting surface intermediate said first and third conducting surfaces;

(d) first means for electrically coupling said second active region to said third conducting surface;

(e) second and third means for electrically coupling said second plates of said first and second capacitive elements to said third conducting surface respectively; and (f) fourth means for electrically coupling said third active regions to said second conducting surface.

30. The device of claim 29 wherein the numbers of said first and second active regions of said semiconductor die are greater than one, respectively, and the number of said third active regions is greater than two.

31. The device of claim 29 wherein said first second and third active regions are transistor collector, base and emitter regions, respectively.

32. The device of claim 29 wherein said first and fourth means are single lead bonds and said second and third means are each pairs of lead bonds.

33. The device of claim 29 wherein the reactances of said first and second capacitive elements and of said first means are substantially equal at the highest frequency in the operating band of said device.

34. The device of claim 29 wherein said capacitive elements are MOS capacitors fabricated upon a portion of a silicon wafer.

35. The device of claim 29 wherein said first and second capacitive elements are disposed in a symmetrically spaced relation with respect to said second and third conducting surfaces.

36. A high power, high frequency transistor comprising:

(a) a metallized ceramic member having first, second and third metallized surfaces disposed thereon in a split ground configuration, said second metallized surface having a first portion thereof intermediate said first and third metallized surfaces and a second portion thereof disposed in elevation over said first metallized surface;

(b) a multicell transistor die disposed upon said first conducting surface, said die having a plurality of collector, emitter and base regions and being arranged and constructed so that said collector regions make intimate electrical contact with said first metallized surface, said emitter regions are interconnected to a plurality of emitter sites and said base regions are interconnected to a plurality of base sites;

(c) first and second capacitors disposed upon said member in symmetrical space relation to said first and second metallized surfaces, said capacitors having first and second plates, said first plates being in electrical contact with said first portion of said second metallized surface intermediate said first and third metallized surfaces;

(d) a plurality of first lead bonds, each of said first lead bonds connecting one of said base sites to said third metallized surface;

(e) first and second pairs of lead bonds, said first and second pairs of lead bonds connecting said second plates of said first and second capacitors to said third conducting surface, respectively, and (f) a plurality of second lead bonds, each of said second lead bonds connecting one of said emitter sites to said second portion of said second metallized surface disposed in elevation over said first metallized surface, wherein the reactances of said first and second capacitors and said first lead bonds are substantially equal at the highest frequency in the operating band.

37. An electrical translating device comprising:

(a) thermally conducting, electrically insulating member having first, second and third electrically conducting surfaces disposed thereon in symmetrically spaced relation with reference to a longitudinal axis of said member, said second conducting surface being generally disposed between said first and third conducting surfaces in a split ground configuration, said first conducting surface having a longitudinal axis colinear with said longitudinal axis of said member;

(b) a semiconductor die disposed upon said first conducting surface, the longitudinal axis of said semiconductor die being colinear with that of said first conducting surface, said semiconductor die having a plurality of first, second and third active regions and being arranged and constructed so that said first active regions make electrical contact with said first conducting surface, said second active regions and said third active regions being interconnected to a plurality of second region sites and third region sites, respectively, said sites being disposed on the upper surface of said die along said longitudinal axis thereof in an alternating pattern;

(c) a first plurality of capacitive elements having first and second plates, said first plurality of capacitive elements being disposed on a first side of said second conducting surface with reference to said longitudinal axis of said member, said first plates thereof being electrically coupled to said second conducting surface, the number of said capacitive elements in said first plurality being equal to the number of said second region sites;

(d) a second plurality of capacitive elements having first and second plates, said second plurality of capacitive elements being disposed on said second conducting surface on a second side thereof opposite said first side thereof, said first and second pluralities of capacitive elements being substantially equidistant from said longitudinal axis of said member, said first plates of said second plurality of capacitive elements being electrically coupled to said second conducting surface, the number of said capacitive elements in said first plurality being equal to the number of said second region sites;

(e) first and second input capacitive elements having first and second plates, said first and second capacitive elements being disposed on first and second sides of said second conducting surface respectively with reference to said longitudinal axis of said member, and equidistant therefrom, said first plates of said first and second capacitive elements being electrically coupled to said second conducting surface;

(f) first means for electrically coupling each of said second region sites to said second plate of one of said capacitive elements comprising said first plurality thereof;

(g) second means for electrically coupling each of said region sites to said second plate of one of said capacitive elements comprising said second plurality thereof;

(h) third means for electrically coupling said second plates of said capacitive elements comprising said first plurality thereof to substantially equidistant and equally spaced locations on a first side of said third conducting surface with reference to said longitudinal axis of said member;

(i) fourth means for electrically coupling said second plates of said capacitive elements comprising said second plurality thereof to substantially equidistant and equally spaced locations on a second side of said third conducting surface opposite said first side thereof with reference to said longitudinal axis of said member;

(j) fifth and sixth means for electrically coupling said second plates of said first and second input capacitive elements to equidistant first and second locations on said third conducting surface, said first and second locations being on opposite sides of, and equidistant from, said longitudinal axis of said member;

(k) seventh means for electrically coupling each of said third region sites to one of a first plurality of equidistant points on said second conducting surface respectively, each of said first plurality of points being located approximately midway between a corresponding pair of said capacitive elements of said first plurality thereof, forming an alternating pattern; and (l) eighth means for electrically coupling each of said third region sites to one of a second plurality of equidistant points on said second conducting surface respectively, each of said second plurality of points being located approximately midway between a corresponding pair of said capacitive elements of said second plurality thereof, forming an alternating pattern, wherein the reactances of said capacitive elements comprising said first and second pluralities thereof and said first and second input capacitive elements are substantially tuned to the reactances of said first, second, third, fourth, seventh and eighth means at the highest frequency in the operating band of said device.

38. The device of claim 37 wherein said first, second and third active regions are transistor collector, base and emitter regions, respectively.

39. The device of claim 37 wherein said first, second, third, fourth, seventh and eighth means are single lead bonds and said fifth and sixth means are each pairs of lead bonds.

40. The device of claim 37 wherein said capacitive elements comprising said first and second pluralities thereof and said first and second input capacitive elements are MOS capacitors.

41. The device of claim 37 wherein said first plurality of capacitive elements are disposed, with substantially uniform spacing thereinbetween, along a first axis which is substantially parallel to said longitudinal axis of said member, and said second plurality of capacitive elements are disposed, with substantially uniform spacing thereinbetween, along a second axis which is substantially parallel to said longitudinal axis of said member.

References Cited

UNITED STATES PATENTS

| | | | |
|---|---|---|---|
| 3,417,393 | 12/1968 | Cook et al. | 317—101 A |
| 3,500,066 | 3/1970 | Pritchett | 317—101 A |
| 3,555,375 | 1/1971 | Hilbers | 317—234 H |
| 3,400,311 | 9/1968 | Dahlberg et al. | 317—234 H |
| 3,387,190 | 6/1968 | Winkler | 317—234 H |
| 3,518,498 | 6/1970 | Early | 317—235 YU |
| 3,543,102 | 11/1970 | Dahlberg et al. | 317—101 H |
| 3,515,952 | 6/1970 | Robinson | 317—234 H |
| 3,617,819 | 11/1971 | Boisvert | 174—52 S |
| 3,486,082 | 12/1969 | Sakamoto | 174—52 S |
| 3,651,434 | 3/1972 | McGeough et al. | 317—234 R |

DAVID SMITH, Jr., Primary Examiner

U.S. Cl. X.R.

317—234 G; 174—52 S